(12) United States Patent
Mita (10) Patent No.: US 7,148,126 B2
(45) Date of Patent: Dec. 12, 2006

(54) SEMICONDUCTOR DEVICE MANUFACTURING METHOD AND RING-SHAPED REINFORCING MEMBER

(75) Inventor: Humiaki Mita, Saitama (JP)

(73) Assignee: Sanken Electric Co., Ltd., Niiza (JP)

( * ) Notice: Subject to any disclaimer, the term of this patent is extended or adjusted under 35 U.S.C. 154(b) by 5 days.

(21) Appl. No.: 10/518,131

(22) PCT Filed: Jun. 24, 2003

(86) PCT No.: PCT/JP03/07975

§ 371 (c)(1),
(2), (4) Date: Dec. 15, 2004

(87) PCT Pub. No.: WO04/001819

PCT Pub. Date: Dec. 31, 2003

(65) Prior Publication Data

US 2005/0250295 A1    Nov. 10, 2005

(30) Foreign Application Priority Data

Jun. 25, 2002  (JP)  ............... 2002-183939
Nov. 1, 2002   (JP)  ............... 2002-319884

(51) Int. Cl.
*H01L 21/46* (2006.01)
(52) U.S. Cl. ..................... 438/464; 438/459
(58) Field of Classification Search ............. 438/928, 438/459, 464
See application file for complete search history.

(56) References Cited

U.S. PATENT DOCUMENTS 5,874,784 A * 2/1999 Aoki et al. ............ 257/787
6,303,471 B1 * 10/2001 Unno et al. ............ 438/464
6,342,434 B1 * 1/2002 Miyamoto et al. ....... 438/464

FOREIGN PATENT DOCUMENTS

JP    2000-12492 A    1/2000
JP    2002-100589 A   4/2002

* cited by examiner

*Primary Examiner*—Michael Lebentritt
*Assistant Examiner*—Elias Ullah
(74) *Attorney, Agent, or Firm*—Howard & Howard Attorneys, P.C.

(57) ABSTRACT

A ring-shaped reinforcing ring (13) formed of, for example, silicon, is adhered to one surface of a thinly processed semiconductor substrate (11). The reinforcing ring (13) is adhered thereto with an organic adhering material layer (14) formed of a metal or alloy with a relatively low melting point or polyimide resin with a relatively low melting point or softening point. Forming a metallic film (15) is executed in a state that the reinforcing ring (13) is adhered to the semiconductor substrate (11). The reinforcing ring (13) has the same outer diameter as that of the semiconductor substrate (11). Moreover, since a total thickness of the thinly processed semiconductor substrate (11) and the reinforcing ring (13) is substantially equal to that of the semiconductor substrate (11) which is not thinly processed, the semiconductor substrate (11) to which the reinforcing ring (13) is adhered can be transferred by the existing transferring unit.

17 Claims, 7 Drawing Sheets

SEMICONDUCTOR DEVICE MANUFACTURING METHOD AND RING-SHAPED REINFORCING MEMBER

TECHNICAL FIELD

The present invention relates to a method for manufacturing a semiconductor device having a relatively thin semiconductor substrate and ring-shaped reinforcing member used therein.

BACKGROUND ART

For example, a power semiconductor device such as a power transistor or the like includes a semiconductor substrate having multiple semiconductor regions formed thereon and electrodes formed on both surfaces of the semiconductor substrate.

Some of power semiconductor devices are miniaturized and thinned in accordance with miniaturization of electronic equipment. The power semiconductor devices of this type generally include a relatively thin semiconductor substrate.

Conventionally, the power semiconductor device having a thin semiconductor substrate is manufactured by, for example, the following processes.

Figure 4A:
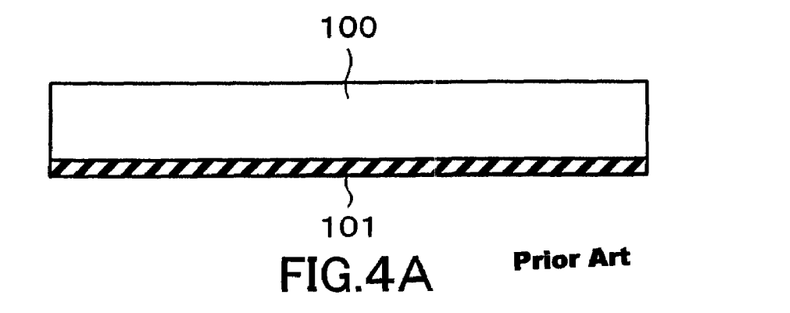
FIGS. 4A to 4E are side views each illustrating a conventional semiconductor device manufacturing method.

First of all, as illustrated in FIG. 4A, a semiconductor substrate 100 is prepared. In a surface region of one surface of the semiconductor substrate 100, multiple semiconductor regions are formed by impurity diffusion and the like. Multiple semiconductor devices are formed of these multiple semiconductor regions. Moreover, on the surface of the semiconductor substrate 100, electrodes such as an emitter electrode, a source electrode, etc. (not shown) are also formed.

Next, a first reinforcing member 101 is adhered to one surface of the semiconductor substrate 100 with an organic adhesive (for example, ultraviolet curable resin).

Figure 4B:
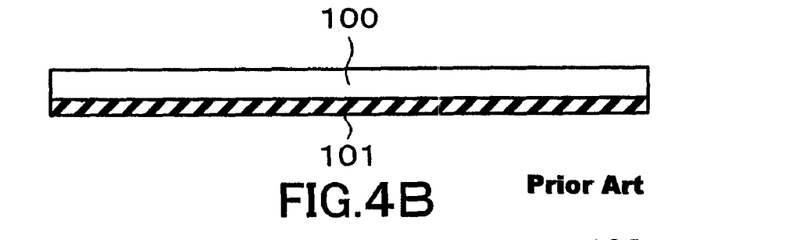
Figure 4C:
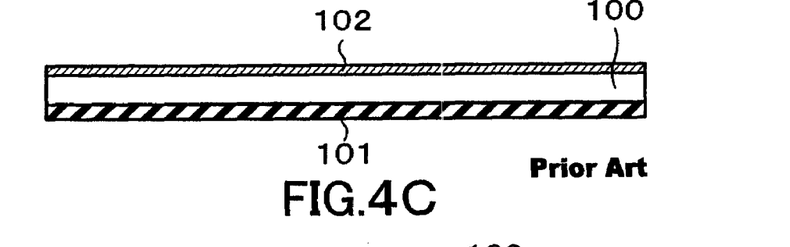

Sequentially, the other surface of the semiconductor substrate 100 is cut or etched to thin the semiconductor substrate 100 as illustrated in FIG. 4B.

When the semiconductor substrate 100 is thinned, intensity of the semiconductor substrate 100 decreases. For this reason, regarding the single use of the semiconductor substrate 100, a nick and a crack easily occur on the semiconductor substrate 100 when it is handled or transferred in the following processes. The first reinforcing member 101 prevents occurrence of the nick and the crack on the semiconductor substrate 100 and enhances the strength of the semiconductor substrate 100 in a state that it is adhered to the semiconductor substrate 100.

After that, a metallic film 102 is formed on the other surface of the semiconductor device 100 by sputtering, vacuum deposition, etc., as illustrated in FIG. 4. The metallic film 102 is patterned to form electrodes such a collector electrode, a drain electrode, and the like.

Figure 4D:
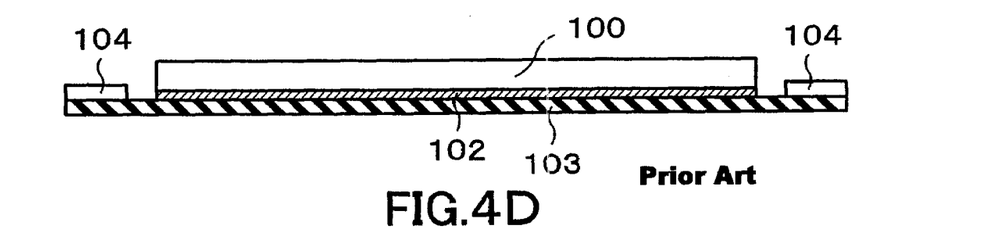

Next, a second reinforcing member 103 to which a ring-shape frame 104 is adhered to the other surface of the semiconductor substrate 100 as illustrated in FIG. 4D. The second reinforcing member 103 fixes each semiconductor device chip when, for example, the semiconductor substrate 100 is diced into the respective chips. After that, the first reinforcing member 101 is removed from the semiconductor substrate 100.

Figure 4E:
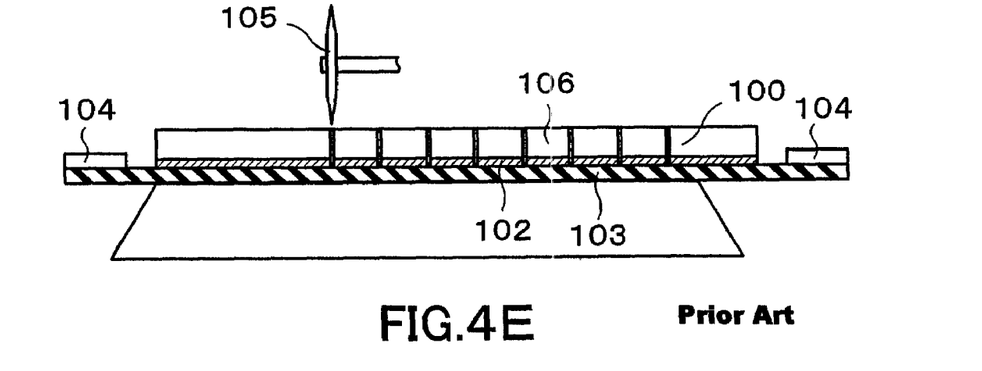

Sequentially, the semiconductor substrate 100 is divided into multiple semiconductor device chips 106 by, for example, a dicing cutter 105 as illustrated in FIG. 4E.

Then, the second reinforcing member 103 is removed from each semiconductor device chip 106. Accordingly, the semiconductor device chips 106 are individually separated and sent to a next process such as bonding and the like.

In the aforementioned conventional manufacturing process, the first reinforcing member 101 is adhered to one surface of the semiconductor substrate 100 with the organic adhesive.

However, in this method, there is a case in which components of the organic adhesive are volatilized when the metallic film 102 is being formed on the other surface of the semiconductor substrate 100, causing an adverse effect on the formation of the metallic film 102.

For example, when the semiconductor substrate 100 to which the first reinforcing member 101 is adhered is subjected to sputtering, vacuum deposition, etc., with a degree of vacuum of about $10^{-5}$ Pa and at a temperature about 100° C. to 200° C., the organic adhesive decomposes to generate gas. The gas reduces the quality of the metallic film 102.

In order to enhance the strength of the semiconductor substrate 100 and prevent the 10 reduction in the quality of the metallic film 102, it can be considered that the semiconductor substrate 100 is transferred in a state that the semiconductor substrate 100 is held by a dedicated jig. However, in the case of using the dedicated jig, the existing transferring unit, cassette, stage, etc., cannot be used, so that a unit for a manufacturing process must be changed in order to correspond to the dedicated jig.

As such, it has been difficult to prevent occurrence of the nick and the crack on the semiconductor substrate, because various problems have been found in the prevention process.

The present invention has been made in consideration of the aforementioned circumstances, and an object of the present invention is to provide a semiconductor device manufacturing method that can easily prevent occurrence of a nick and a crack on a semiconductor substrate and a ring-shaped reinforcing member used therein.

Also, an object of the present invention is to provide a semiconductor device manufacturing method that can form electrodes with high reliability and a ring-shaped reinforcing member used therein.

Furthermore, an object of the present invention is to provide a semiconductor device manufacturing method that can prevent occurrence of a nick and a crack on a semiconductor substrate without increasing manufacturing cost and a ring-shaped reinforcing member used therein.

DISCLOSURE OF INVENTION

In order to achieve the above object, a semiconductor device manufacturing method according to a first aspect of the present invention includes a first step of preparing a semiconductor substrate (11) on which multiple semiconductor devices are formed and thinning the semiconductor substrate (11); a second step of adhering a reinforcing member (13) through which a part of one surface of the semiconductor substrate (11) is exposed to the one surface thereof with an adhering material; a third step of forming a metallic film (15) for forming an electrode provided in the semiconductor device on an exposed portion of one surface of the semiconductor substrate (11) or the other surface of the semiconductor substrate (11); and a fourth step of removing the reinforcing member (13) from the semiconductor substrate (11) and dicing the semiconductor substrate (11); and wherein the adhering member (13, 25) is formed of material whose state changes at temperature higher than a processing temperature in the third step.

In this way, according to this manufacturing method, the ring-shaped reinforcing member is adhered to the semiconductor substrate whose strength is reduced by thinly processing to prevent the nick and the crack on the semiconductor substrate. The use of the ring-shaped reinforcing member with the outer diameter equal to that of the semiconductor substrate eliminates the need for changing the transferring unit and cassette according to the dedicated jig, unlike the case, for example, in which the dedicated jig for enhancing strength of the thinly processed semiconductor substrate is used. Moreover, according to this manufacturing method, as an adhering material for adhering the ring-shaped reinforcing member to the semiconductor substrate, a material is used that does not change its state at temperature added thereto when the metallic film is formed. For this reason, under the metallic film forming conditions, the adhering material does not generate gas that is due to its melting and that adversely influences formation of the metallic film. This makes it possible to form electrodes with high reliability.

The reinforcing member (13) may have an opening at its center and a ring shape with an outer diameter equal to an outer diameter of the semiconductor substrate (11). And in the second step, the ring-shaped reinforcing member (13) may be adhered to one surface of the semiconductor substrate (11) by the adhering material in a state that an outer periphery of the reinforcing member (13) is matched with an outer periphery of the semiconductor substrate (11), In the third step, the metallic film (15) may be formed on one surface of the semiconductor substrate (11) which is exposed through the opening of the ring-shaped reinforcing member (13).

The adhering material may be formed of a metal or alloy having a melting point higher than a processing temperature in the third step or heat resistance resin having a melting point or a softening point higher than the processing temperature in the third step.

The heat resistance resin may be polyimide resin.

In the second step, the adhering material layer (14, 25) may be formed on one surface of the ring-shaped reinforcing member (13), the surface of the ring-shaped reinforcing member (13) may be placed on one surface of the semiconductor substrate (11) and the adhering material layer (14, 25) disposed between the ring-shaped reinforcing member (13) and the semiconductor substrate (11) may be melted, and the adhering material layer (14, 25) may be hardened by cooling to adhere the ring-shaped reinforcing member (13) to the semiconductor substrate (11).

In the first step, a first tape reinforcing member (12) may be adhered to the other surface of the prepared semiconductor substrate (11) with an organic adhesive and one surface of the semiconductor substrate (11) may be thinly processed in a state that the first tape reinforcing member (12) is adhered, thereby thinning the semiconductor substrate (11) up to a predetermined thickness; in the second step, the ring-shaped reinforcing member (13) may be adhered to one surface of the semiconductor substrate with the adhering material layer (14) in a state that the first tape reinforcing member (12) is adhered to the other surface of the semiconductor substrate (11); and in the third step, the metallic film (15) may be formed on one surface of the semiconductor substrate (11) through the opening of the ring-shaped reinforcing member (13) after removing the first reinforcing member (12) from the semiconductor substrate (11) in a state that the ring-shaped reinforcing member (13) is adhered to the semiconductor substrate (11).

The adhering material layer (14) may have a melting point lower than heat resistance temperature of the first tape member (12).

Moreover, in the fourth step, a second tape reinforcing member (18) may be adhered to the other surface of the semiconductor substrate (11), the ring-shaped reinforcing member (13) may be removed from one surface of the semiconductor substrate (11), and the semiconductor substrate (11) may be diced into chips (22) that form the respective semiconductor devices.

The adhering material layer (14) may have a melting point lower than heat resistance temperature of the second tape reinforcing member (18); and the adhering material layer (14) may be melted by heating at temperature lower than heat resistance temperature of the second tape reinforcing member (18), thereby removing the ring-shaped reinforcing member (13) from the semiconductor substrate (11).

In the first step, a first tape reinforcing member (11) is adhered to the other surface of the prepared semiconductor substrate (11) with an organic adhesive and one surface of the semiconductor substrate (11) may be thinly processed, thereby thinning the semiconductor substrate (11) up to a predetermined thickness; and in the second step, the semiconductor substrate (11) may be fixed onto a stage (24) having a heater, the semiconductor substrate (11) fixed onto the stage (24) may be heated, thereby reducing warpage caused on the semiconductor substrate (11) by a difference between a coefficient of linear expansion of the first tape reinforcing member (12) and a coefficient of linear expansion of the semiconductor substrate (11).

Furthermore, in order to solve the aforementioned problem, a ring-shaped reinforcing member according to a second aspect of the present invention is used in a manufacturing process of a semiconductor device having a semiconductor substrate (11) thinned to a predetermined thickness. The reinforcing member has an opening at its center, and has a ring shape with an outer diameter equal to an outer diameter of the semiconductor substrate (11), and is adhered to one surface of the semiconductor substrate (11) with an adhering material, thereby enhancing strength of the semiconductor substrate (11) reduced by thinly processing.

The ring-shaped reinforcing member is adhered to the semiconductor substrate with the adhering material formed of, for example, an inorganic adhesive and polyimide resin, thereby enhancing strength of the semiconductor substrate reduced by thinly processing. Moreover, since the ring-shaped reinforcing member is adhered to the semiconductor substrate with, for example, the inorganic adhesive and polyimide resin, no gas is generated under processing conditions for forming an electrode on one or the other surface of the semiconductor substrate. Furthermore, since the ring-shaped reinforcing member has the same outer diameter as that of the semiconductor substrate, there is no need of changing the existing transferring unit and the like to be suitable for the dedicated jig, unlike the case in which the semiconductor substrate is held by the dedicated jig. Accordingly, it is possible to prevent occurrence of the nick and the crack on the thinly processed semiconductor substrate without largely changing the manufacturing unit and increasing manufacturing cost.

The ring-shaped reinforcing member may have a thickness larger than a predetermined thickness of the thinly processed semiconductor device.

The ring-shaped reinforcing member may be formed of the same material as that of the semiconductor substrate (11) and have a coefficient of linear expansion equal to that of the semiconductor substrate (11).

BEST MODE FOR CARRYING OUT THE INVENTION

A semiconductor device manufacturing method and a ring-shaped reinforcing member used therein according to embodiments of the present invention will be described below with reference to the drawings. The following explains a case in which a power transistor is manufactured as an example.

(First Embodiment)

An explanation is given of a semiconductor device manufacturing method and a ring-shaped reinforcing member used therein according to this embodiment with reference to FIGS. 1A to 1J and FIG. 2.

Figure 1A:
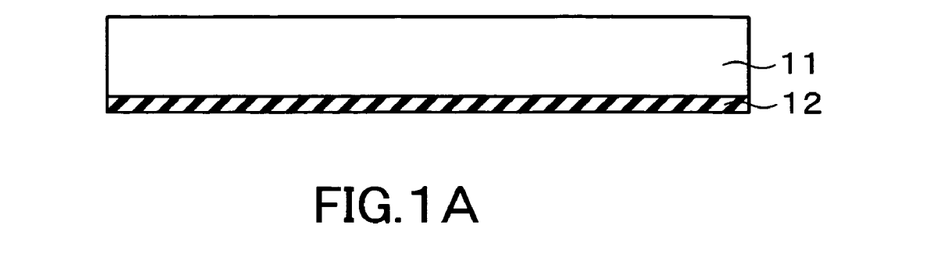
FIGS. 1A to 1J are side views each illustrating a semiconductor device manufacturing method according to a first embodiment of the present invention.

First of all, a semiconductor substrate (semiconductor wafer) 11 is prepared as illustrated in FIG. 1A. The semiconductor substrate 11 is formed of for example, a single crystal silicon, and has a substantially circular shape with a size of, for example, a thickness of 500 μm and a diameter of 15 mm (6 inches). In a surface region of one surface of the semiconductor substrate 11, multiple semiconductor regions (not shown) for forming multiple semiconductor devices are formed by impurity diffusion and the like. Moreover, on one surface of the semiconductor substrate 11, a metallic film (not shown) is formed by sputtering, vacuum deposition, etc. The metallic film forms one end of the electrode of the semiconductor device, for example, an emitter electrode and a base electrode of the power transistor.

Next, a first tape member 12 is adhered to one surface of the semiconductor substrate 11 with an ultraviolet curable adhesive, a low-tack adhesive, and an organic adhesive such as thermoplastic resin. The first tape member 12 is formed of resin with high heat resistance, for example, polyethylene terephthalate resin, vinyl chloride resin, and polyolefin resin. The first tape member 12 protects one surface of the semiconductor substrate 11 and prevents occurrence of the nick and the crack on the semiconductor substrate 11 at the time of thinning the semiconductor substrate 11 in a next process.

Figure 1B:
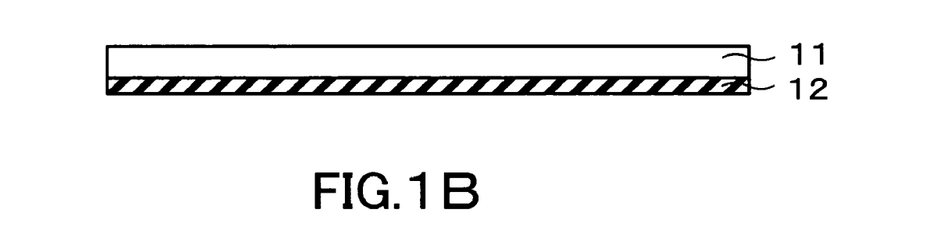

Next, a portion of the semiconductor substrate 11 that is close to the other surface of the semiconductor substrate 11 is removed by back grinding (cutting process) and chemical etching to thin the semiconductor substrate 11 as illustrated in FIG. 1B. For example, a semiconductor substrate with an original thickness of 500 μm is thinned up to 100 μm. Since the semiconductor substrate 11 is reinforced by the first tape member 12 adhered to one surface, occurrence of the nick and the crack by a mechanical stress generated at the time of the thinning process is restrained or prevented.

Figure 1C:
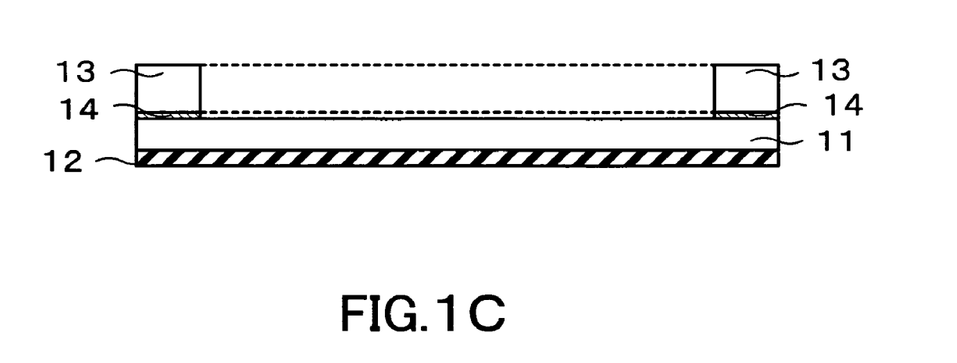

Sequentially, a reinforcing ring 13 is adhered to the other surface of the semiconductor substrate 11 as illustrated in FIG. 1C. The reinforcing ring 13 includes he same material as that (for example, single crystal silicon) of the semiconductor substrate 11 and is formed by cutting a central portion of a disk-like silicon substrate circularly.

Figure 2:
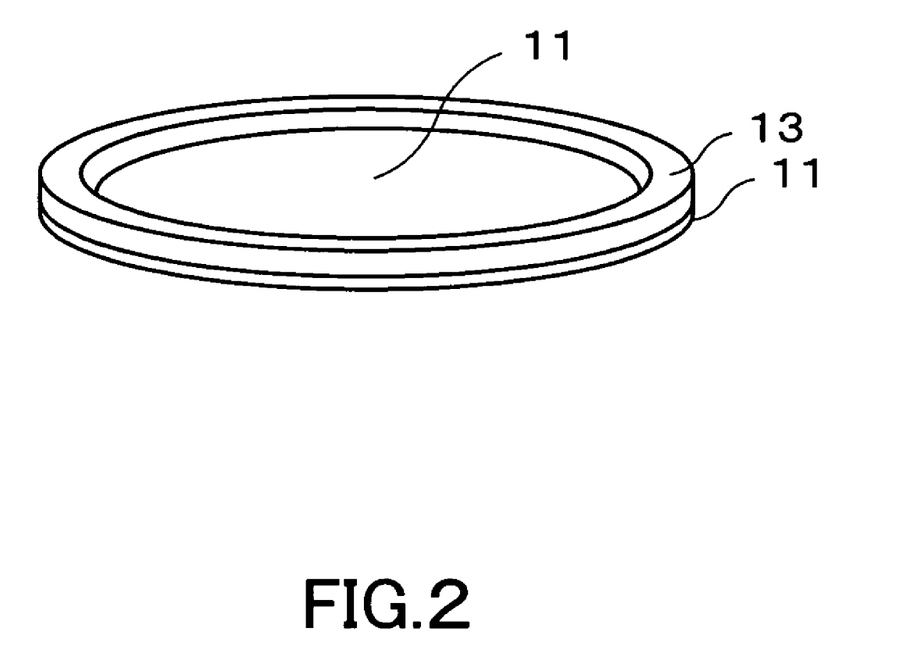
FIG. 2 is a perspective view illustrating a state that a reinforcing ring is adhered to a semiconductor substrate.

FIG. 2 illustrates a state in which the reinforcing ring 13 is adhered to the semiconductor substrate 11. As illustrated in the figure, an outer diameter of the reinforcing member 13 is set to the same as that of the semiconductor substrate 11. The reinforcing member 13 is adhered to an outer periphery of the semiconductor substrate 11. In this state, the other surface of the semiconductor substrate 11 is exposed as a region for electrode via the central portion (circularly cut portion) of the reinforcing member 13. For example, the reinforcing member 13 has a width of 5 to 7 mm and a thickness of about 400 to 900 μm and is formed to have a size and a shape such that strength of the semiconductor substrate 11 is sufficiently obtained and the region for electrode can be sufficiently exposed. Additionally, the thickness of the reinforcing ring 13 may be preferably set to a value larger than the thickness of the thinned semiconductor substrate 11 among the semiconductor substrates 11. More preferably, the reinforcing member 13 may be formed in such a way that a thickness obtained by combining the thinned semiconductor substrate 11 with the reinforcing ring 13 is substantially the same as a thickness obtained by combining the non-thinned semiconductor substrate 11 with the tape member 12. In this embodiment, the semiconductor substrate 11 is cut by 400 μm and the reinforcing ring 13 has a thickness of about 600 μm.

The reinforcing ring 13 is adhered to the semiconductor substrate 11 with an inorganic adhering material layer 14. The inorganic adhering material layer 14 is formed of, for example, material that forms the semiconductor substrate 11, namely, an inorganic material with a good adhesive property to silicon. Moreover, the inorganic material 14 has a melting point, which is lower than heat resistance temperature of the first tape member 12 and higher than temperature (for example, 100° C. to 200° C.) at which sputtering and vacuum deposition processes to be described later are executed.

As the inorganic material that meets such a condition, for example, metals such as indium (melting point of 156.6° C.), tin (melting point of 232° C.), bismuth (melting point of 271.4° C.), etc., or an alloy of these are cited. The inorganic material is selected according to temperature at which sputtering and vacuum deposition processes are executed and the heat resistance temperature of the first tape member 12.

For example, a melting point (liquid phase temperature) of an alloy formed of tin of 42% and bismuth of 58% is 138.5° C., a melting point (liquid phase temperature) of an alloy formed of lead of 44.5% and bismuth of 45.5% is 124° C., a melting point (liquid phase temperature) of an alloy formed of tin of 60% and bismuth of 40% is 170° C., a melting point (liquid phase temperature) of an alloy formed of indium of 52% and tin of 48% is 117° C., and a melting point (liquid phase temperature) of an alloy formed of indium of 50% and tin of 50% is 127° C.

Specifically, adhesion of the reinforcing ring 13 to the semiconductor substrate 11 using the inorganic adhering material layer 14 as mentioned above can be executed by the following way.

First of all, the inorganic adhering material layer 14 is formed on one surface of the reinforcing ring 13 by plating. The inorganic adhering material layer 14 is formed on one surface of the reinforcing ring 13 entirely or scattered thereon in such a way that the semiconductor substrate 11 and the reinforcing ring 13 are sufficiently adhered to each other.

Next, one surface of the reinforcing ring 13 on which the inorganic adhering material layer 14 is formed is placed on the other surface of the semiconductor substrate 11. Sequentially, the result is heated at temperature at which the inorganic adhering material layer 14 is melted (temperature more than the melting point of the metal or alloy that forms the inorganic adhering material layer 14). Then, the result is cooled to cure the inorganic adhering material layer 14, so that the reinforcing ring 13 is adhered to the semiconductor substrate 11.

As mentioned above, the melting point of the metal or alloy that forms the inorganic adhering material layer 14 is lower than the heat resistance temperature of the first tape member 12. This prevents the first tape member 12 from deteriorating by the heat at the time of heating and melting the inorganic adhering material layer 14.

Figure 1D:
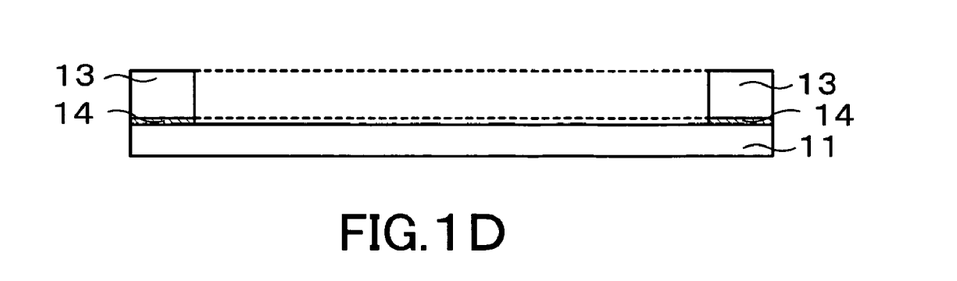

After adhesion of the reinforcing ring 13, the first tape member 12 is peeled and removed from one surface of the semiconductor substrate 11 as illustrated in FIG. 11D. For example, in the case where the first tape member 12 is adhered to the semiconductor substrate 11 with the organic adhesion formed of ultraviolet curable resin, the adhesive is irradiated with an ultraviolet ray. This causes a polymerization reaction to reduce adhesive strength of the adhesive, so that the first tape member 12 can be easily peeled from the semiconductor substrate 11.

Next, in order to form a metallic film (electrode) on the other surface of the semiconductor substrate 11, the semiconductor substrate 11 is transferred to a metallic film forming unit. Additionally, since the reinforcing ring 13 is adhered to the semiconductor substrate 11 at the transferring time, strength of the semiconductor substrate 11 is sufficiently ensured and occurrence of the nick and the crack is restrained or prevented.

Moreover, as mentioned above, the total thickness of the semiconductor substrate 11 (for example, 100 μm) and the reinforcing ring 13 (for example, 600 μm) is substantially the same as the thickness of the original semiconductor substrate 11 which is not thinned. This makes it possible to transfer the semiconductor substrate 11 and the reinforcing ring 13 using the existing transferring apparatus for transferring the conventional non-thinned semiconductor substrate 11.

Figure 1E:
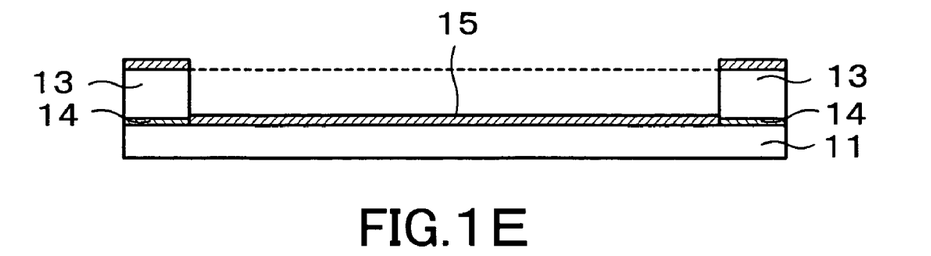

After transferring, a metallic film 15 is formed on the other surface of the semiconductor substrate 11 by sputtering, vacuum deposition, etc., as illustrated in FIG. 1E. The metallic film 15 is formed of, for example, titanium, nickel, gold, platinum, etc. and has a thickness of, for example, 0.5 μm. The metallic film 15 forms, for example, a collector electrode of a power transistor. The metallic film 15 is formed on not only the other surface of the semiconductor substrate 11 but also the upper surface of the reinforcing ring 13.

At the time of forming the metallic film 15, the reinforcing ring 13 is adhered to the other surface of the semiconductor substrate 11 with the inorganic adhering material layer 14. The inorganic adhering material layer 14 is formed of the metal or alloy whose melting point is higher than processing temperature for sputtering, vacuum deposition, etc. as mentioned above. Accordingly, the inorganic adhering material layer 14 does not change its state or generate gas under conditions for forming the metallic film 15, for example, processing temperature of 100° C. to 200° C. and vacuum density of about $10^{-5}$ Pa ($10^{-7}$ Torr), unlike the organic adhesive.

Since the inorganic adhering material layer 14 is not melted by heat at the film forming time, the semiconductor substrate 11 can maintain the state in which the semiconductor substrate 11 is surely held by the reinforcing ring 13.

In this way, the reinforcing ring 13 is adhered to the semiconductor substrate 11 with the adhering material formed of an inorganic material, thereby making it possible to form the metallic film 15 with high reliability without an adverse influence.

After forming the metallic film 15, the metallic film 15 is patterned to form an electrode as required.

Sequentially, the semiconductor substrate 11 is transferred to the other processing unit. At the time of transferring, the semiconductor substrate 11 is also reinforced by the reinforcing ring 13 and a sufficient thickness is given thereto by the reinforcing ring 13, hereby making it possible to transfer the semiconductor substrate 11 using the existing transferring apparatus for transferring the conventional non-thinned semiconductor substrate 11.

Figure 1F:
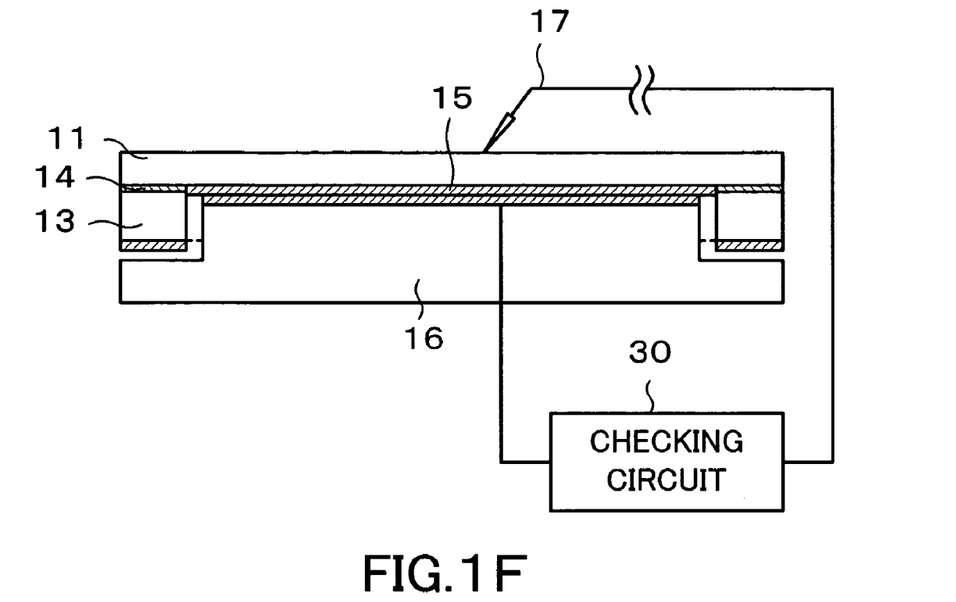

A convex stage (susceptor) 16 for mounting the semiconductor substrate 11 thereon is provided on the processing unit as illustrated in FIG. 1F. An upper surface of a convex portion of the stage 16 is formed to have a flat surface with a diameter smaller than an inner diameter of the reinforcing ring 13. On the flat surface, the semiconductor substrate 11 whose surface (other surface) to which the reinforcing ring 13 is adhered is directed downward is mounted. Accordingly, the metallic film 15 formed on the other surface of the semiconductor substrate 11 and the flat surface come in contact with each other.

In the convex portion of the stage 16, at least a portion contacting the metallic film 15 is formed of metal and connected to a checking circuit 30. The checking circuit 30 is also connected to a probe 17 provided in the processing unit. The probe 17 comes in contact with the electrode formed on one surface of the semiconductor substrate 11 to make distinction between a non-defective item and a defective item by ink marking, mapping, etc.

Figure 1G:
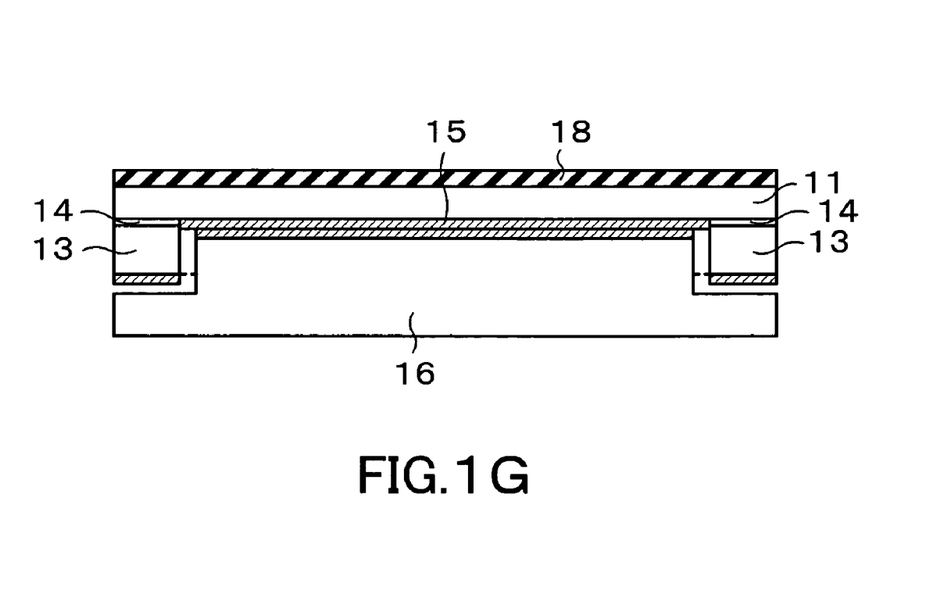

Next, a second tape member 18 is adhered to one surface of the semiconductor substrate 11 using the organic adhesive (not shown) as illustrated in FIG. 1G The second tape member 18 is formed of resin material having a heat resistance temperature higher than the melting point of the inorganic adhering material layer 14, similar to the first tape member 12.

Figure 1H:
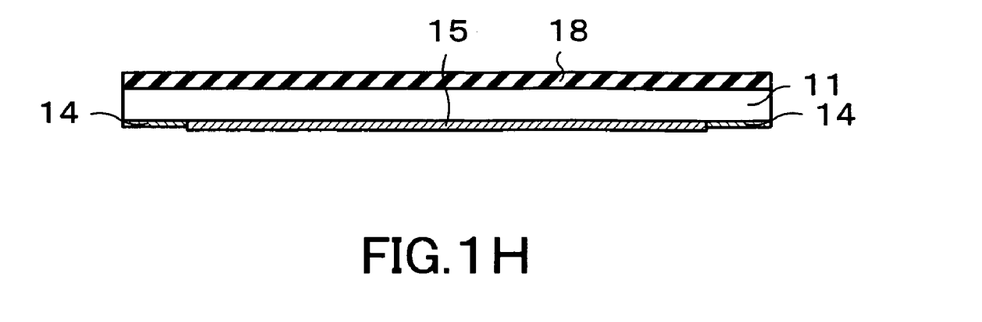

Sequentially, the semiconductor substrate 11 is heated at temperature more than the melting temperature of the inorganic adhering material layer 14 in a state that the second tape member 18 is adhered to one surface and the reinforcing ring 13 is adhered to the other surface, respectively. As a result, the inorganic adhering material layer 14 is melted and the reinforcing ring 13 is removed from the semiconductor substrate 11 as illustrated in FIG. 1H. Since the heat resistance temperature of the second tape member 18 is higher than the melting point of the inorganic adhering material layer 14, no deterioration occurs when the reinforcing ring 13 is removed.

Since the second tape member 18 is adhered to one main surface of the semiconductor substrate 11, strength of the semiconductor substrate 11 is sufficiently maintained even after the reinforcing ring 13 is removed. Additionally, in this state, the inorganic material remains on the other surface of the semiconductor substrate 11 and is adhered thereto.

Figure 1I:
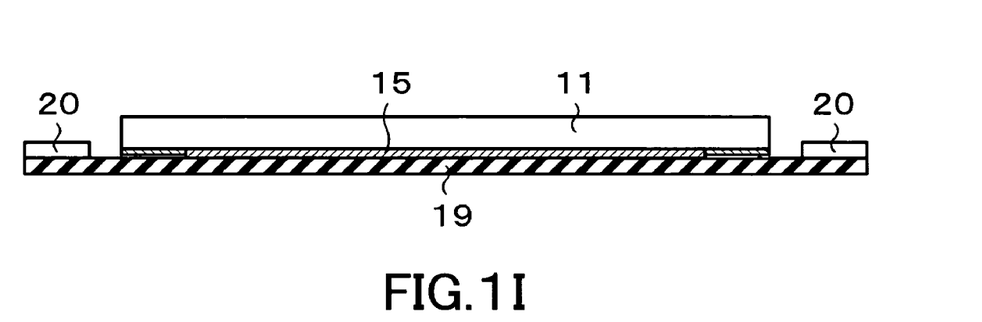

Next, a dicing tape 19 is adhered to the other surface of the semiconductor substrate 11 as illustrated in FIG. 1I. The dicing tape 19 is formed of polyvinyl chloride, polyester, and the like. The dicing tape 19 is held by a ring-shape carrier member 20 provided on the outer periphery.

Sequentially, the second tape member 18 is removed from the semiconductor substrate 11. In the case where the second tape member 18 is adhered to one surface of the semiconductor substrate 11 with the ultraviolet curable adhesive, the second tape member 18 is removed by being irradiated with the ultraviolet ray.

Figure 1J:
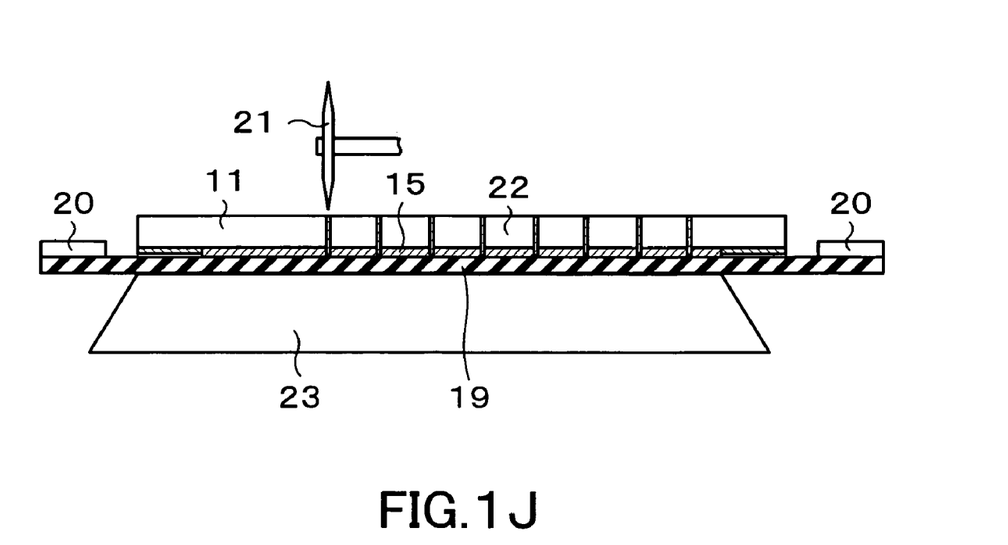

Next, the semiconductor substrate 11 is mounted on a dicing stage 23 in such a way hat the dicing tape 19 comes in contact with the upper surface of the dicing stage 23 as illustrated in FIG. 1J. The dicing stage 23 is formed of, for example, porous material. The semiconductor substrate 11 mounted on the dicing stage 23 is fixed to the upper surface of the dicing stage 23 by suction from the downward of the dicing stage 23.

Next, the semiconductor substrate 11 is diced by a dicing cutter 21. Accordingly, he respective semiconductor devices (dies) 22 are separated from the semiconductor substrate 11. Since the dicing tape 19 is adhered to the semiconductor substrate 11 with, for example, the ultraviolet curable adhesive, irradiation of the ultraviolet ray is applied in order to peel the dicing tape 19 from each die 22. Then, each die 22 is picked up by a suction jig, which is called a collet, and transferred to a unit for executing a next process such as a die boding and the like.

As mentioned above, according to the present embodiment, in the semiconductor device manufacturing method using the relatively thin semiconductor substrate 11, the reinforcing ring 13 formed of silicon is adhered to the semiconductor substrate 11 with the inorganic adhering material layer 14 formed of the metal or alloy, so that the metallic film 15 is formed.

The above-structured reinforcing ring 13 and inorganic adhering material layer 14 are used, so that the electrode can be formed by sputtering, vacuum deposition, etc. without adhering the tape member to the semiconductor substrate 11 with the organic adhesion for reinforcement. This makes it possible to form the electrode (metallic film 15) in a state that no gas is generated from the organic adhesive and to manufacture the semiconductor device with high reliability. Moreover, it is possible to maintain the state in which the thinned semiconductor substrate 11 is held by the reinforcing ring 13 without melting the inorganic adhesion layer 14 at the film forming time. For this reason, occurrence of the nick and the crack in semiconductor substrate 11 is prevented.

Furthermore, the inorganic adhering material layer 14 is formed of the metal or alloy having the melting point lower than the heat resistance temperature of the first tape member 12. For this reason, it is possible to adhere the reinforcing ring 13 to the semiconductor substrate 11 by melting the inorganic adhering material layer 14 in a state that the first tape member 12 is adhered to the semiconductor substrate 11, without degrading the first tape member 12.

Moreover, a total thickness of the thinned semiconductor substrate 11 and the reinforcing ring 13 is substantially the same as the thickness of the original semiconductor device, which is not thinly processed. For this reason, the existing transferring apparatus can be used as it is. Accordingly, the use of the reinforcing ring 13 of this embodiment makes it possible to prevent occurrence of the nick and the crack on the thin semiconductor substrate 11 without largely increasing manufacturing cost.

(Second Embodiment)

This embodiment explains a semiconductor device manufacturing method when the reinforcing ring 13 is adhered to the semiconductor substrate 11 with heat resistance resin, which is formed of polyimide, in place of the inorganic adhering material layer 14. The semiconductor device manufacturing method of this embodiment will be explained below with reference to FIGS. 3A to 3G.

First of all, the semiconductor substrate 11 is prepared. Similar to the first embodiment, multiple semiconductor devices are formed on the semiconductor substrate 11. Moreover, electrodes are formed on one surface of the semiconductor substrate 11.

Next, the first tape member 12 is adhered to one surface of the semiconductor substrate 11 with, for example, an ultraviolet curable adhesive and the semiconductor substrate 11 is thinned. Even in this embodiment, the semiconductor substrate 11 with an original thickness of 500 μm is thinned up to 100 μm.

Figure 3A:
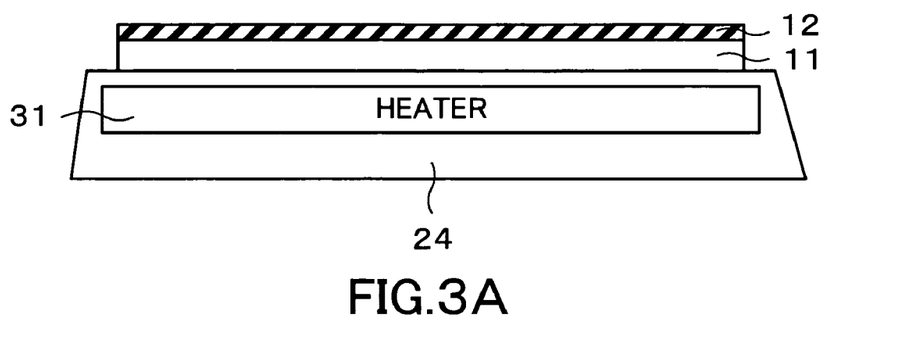
FIGS. 3A to 3G are side views each illustrating a semiconductor device manufacturing method according to a second embodiment of the present invention.

Sequentially, the semiconductor substrate 11 is mounted on an absorption stage 24 in a state that the other surface to which the first tape member 12 is adhered is directed upwardly as illustrated in FIG. 3A. The absorption stage 24 is formed of, for example, porous material. The semiconductor substrate 11 is fixed onto the absorption stage 24 by suction from the downward of the absorption stage 24.

The absorption stage 24 includes a heater 31, sets temperature of an absorption surface (surface on which the semiconductor substrate 11 is mounted) to be higher than a room temperature by about 5 to 70° C., and heats the semiconductor substrate 11. The absorption stage 24 heats the mounted semiconductor substrate 11 to temperature (for example, 40 to 70° C.), which is higher than the room temperature by several tens of degrees Celsius.

There is a case in which warpage occurs on the semiconductor substrate 11 to which the first tape member 12 is adhered by a difference in a coefficient of linear expansion between the semiconductor substrate 11 and the first tape member 12. The warpage is reduced by heating by the absorption stage 24.

To explain more specifically, the first tape member 12 is adhered to one surface of the semiconductor substrate 11 in a state that the semiconductor substrate 11 is heated to a predetermined temperature. For this reason, when the temperature of the semiconductor substrate 11 decreases, warpage occurs on the semiconductor substrate 11 by the difference in the coefficient of linear expansion in some cases. For this reason, the semiconductor substrate 11 to which the first tape member 12 is adhered is heated again on the absorption stage 24 to reduce warpage caused by the difference in the coefficient of linear expansion. This makes it possible to execute the processing in the following various processes with high accuracy.

Figure 3B:
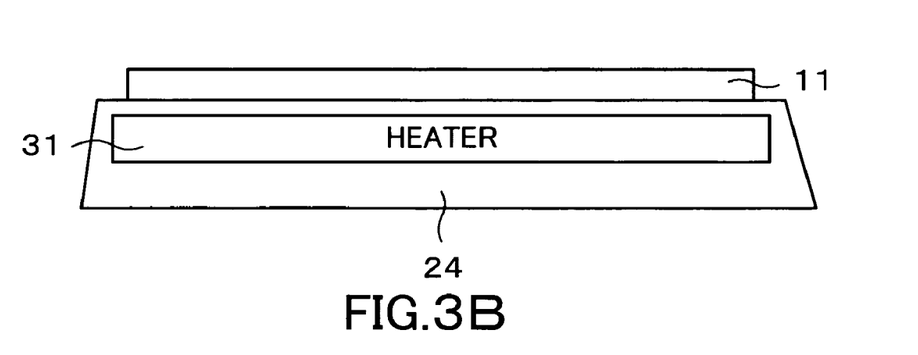

Next, the first tape member 12 is removed from the semiconductor substrate 11 fixed onto the absorption stage 24.

Figure 3C:
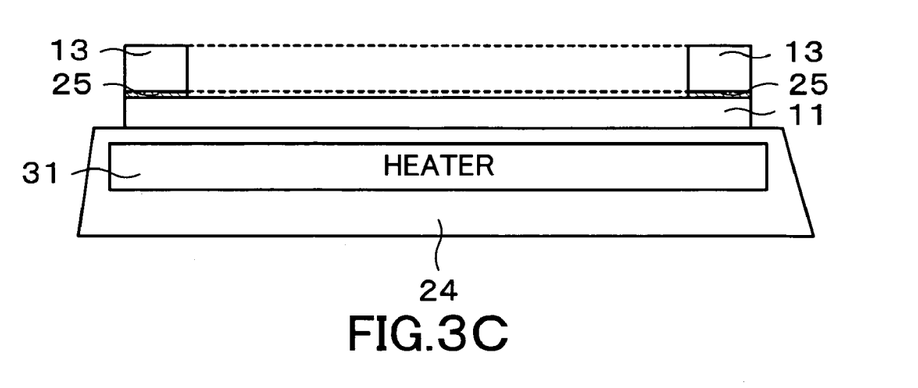

Subsequently, the same reinforcing ring 13 as that of the first embodiment is prepared and adhered to the semiconductor substrate 11 with the heat resistance adhering material layer 25 as illustrated in FIG. 3C.

The heat resistance adhering material layer 25 is formed of, for example, polyimide resin. The heat resistance adhering material layer 25 has a melting point or softening point, which is higher than temperature (for example, 100 to 200° C.) at which sputtering and vacuum deposition processes to be described later are executed.

Specifically, adhesion of the reinforcing ring 13 to the semiconductor substrate 11 using the heat resistance adhering material layer 25 can be executed by the following way.

First of all, for example, melted or softened heat resistance adhering material is applied onto one surface of the reinforcing ring 13 to form a heat resistance adhering material layer 25.

Next, the reinforcing ring 13 is mounted on the semiconductor substrate 11 in such a way that one surface of the reinforcing ring 13 and one surface of the semiconductor substrate 11 are opposed to each other. The semiconductor substrate 11, the reinforcing ring 13 and the heat resistance adhering material layer 25 are heated at temperature which is higher than temperature at which sputtering and vacuum deposition processes to be described later are executed, and the heat resistance adhering material layer 25 is melted or softened again.

Then, the semiconductor substrate 11, the reinforcing ring 13 and the heat resistance adhering material layer 25 are cooled to adhere the reinforcing ring 13 to the semiconductor substrate 11.

Adhesion of the reinforcing ring 13 is executed after peeling the first tape member 12 from the semiconductor substrate 11. However, since the semiconductor substrate 11 is fixed onto the absorption stage 24, strength of the semiconductor substrate 11 is sufficiently ensured. This restrains or prevents occurrence of the nick and the crack in semiconductor substrate 11 at the time of adhering the reinforcing ring 13.

After adhering the reinforcing ring 13, the semiconductor substrate 11 is transferred to a metallic film forming unit for forming a metallic film. At the transferring time, since the reinforcing ring 13 is adhered to the semiconductor substrate 11, strength of the semiconductor substrate 11 is sufficiently ensured to restrain or prevent occurrence of the nick and the crack.

The total thickness of the semiconductor substrate 11 and the reinforcing ring 13 is substantially the same as the thickness of the non-thinned semiconductor substrate 11. For this reason, it is possible to transfer the semiconductor substrate 11 and the reinforcing ring 13 using the existing transferring apparatus for transferring the conventional non-thinned semiconductor substrate 11.

Figure 3D:
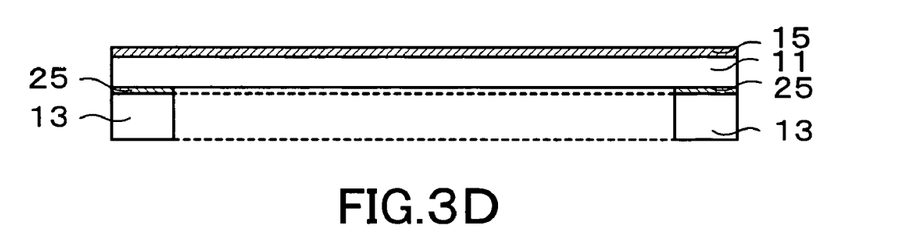

After transferring the semiconductor substrate 11 to the metallic film forming unit, the metallic film 15 is formed on the other surface of the semiconductor substrate 11 by sputtering, vacuum deposition, etc., as illustrated in FIG. 3D. The metallic film 15 is formed of, for example, titanium, nickel, gold, platinum, etc. and has a thickness of, for example, 0.5 μm.

At the time of forming the metallic film 15, the reinforcing ring 13 is adhered to the semiconductor substrate 11 with the heat resistance adhering material layer 25 formed of polyimide resin. As mentioned above, since the heat resistance adhering material layer 25 has a melting point or a softening point which is higher than temperature at which sputtering and vacuum deposition processes are executed, no gas is generated by decomposition under electrode forming conditions of processing temperature, namely, 100° C. to 200° C. and vacuum density of about $10^{-5}$ Pa ($10^{-7}$ Torr).

In this way, the reinforcing ring 13 is adhered to the semiconductor substrate 11 with the adhering material formed of polyimide resin, thereby making it possible to form the metallic film 15 without an adverse influence.

After forming the metallic film 15, the metallic film 15 is patterned as required to form, for example, a collector electrode of the power transistor.

Sequentially, the semiconductor substrate 11 is transferred to the other processing unit. At the time of transferring, the semiconductor substrate 1, which is stably held by the reinforcing ring 13, can be transferred by the existing transferring apparatus.

Figure 3E:
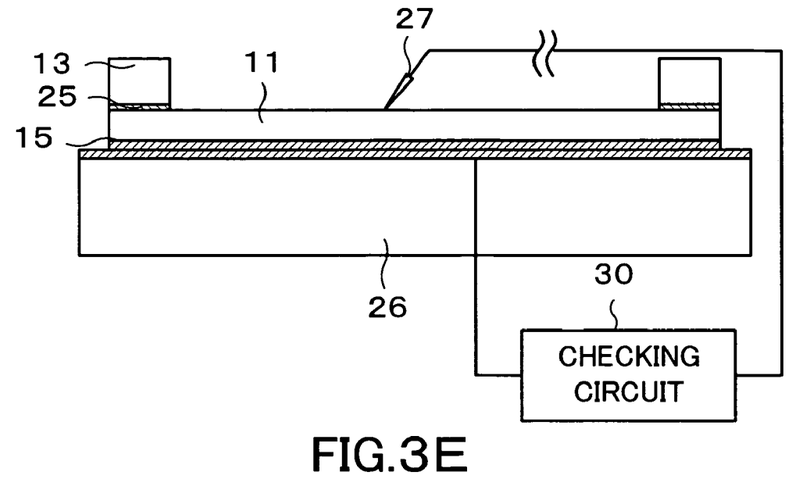

A stage 26 with a flat plane is provided in the processing unit as illustrated FIG. 3E. The transferred semiconductor substrate 11 is mounted on the flat surface of the stage 26. As illustrated, since the semiconductor substrate 11 is mounted on the stage 26 in a state that the surface to which the reinforcing ring 13 is attached is directed upwardly, the stage 26 does not have to have a convex shape, unlike the stage 16 of the first embodiment.

At least a portion of the stage 26 coming in contact with the semiconductor substrate 11 is formed of metal and connected to the checking circuit 30. The checking circuit 30 is also connected to a probe 27 provided in the processing unit. Checking is executed by the probe 27, similar to the first embodiment.

Figure 3F:
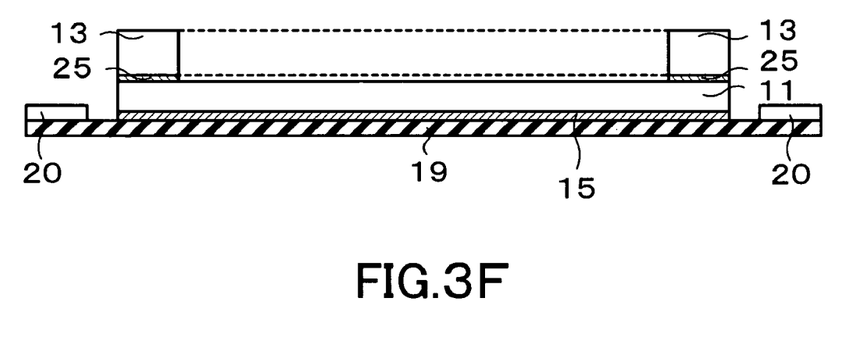

After checking, the dicing tape 19 is adhered to the other surface of the semiconductor substrate 11, similar to the first embodiment, as illustrated in FIG. 3F. The dicing tape 19 is formed of polyvinyl chloride, polyester, and the like. The dicing tape 19 is held by the ring carrier member 20 provided along the outer periphery.

Figure 3G:
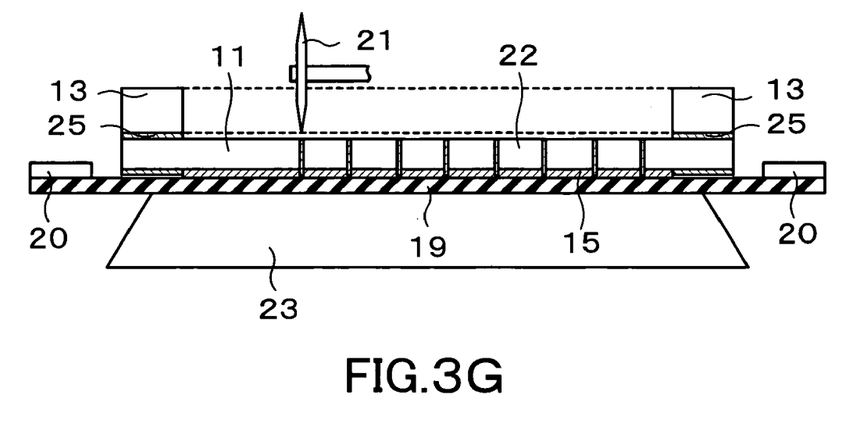

Next, the semiconductor 11 is mounted on the dicing stage 23 as illustrated in FIG. 3G. More specifically, the semiconductor 11 is mounted on the dicing stage 23 in such a way that the dicing tape 19 adhered to the other surface of the semiconductor substrate 11 comes in contact with the upper surface of the dicing stage 23. The semiconductor substrate 11 mounted on the dicing stage 23 is fixed onto the upper surface of the dicing stage 23 by suction from the downward of the dicing stage 23.

Then, similar to the first embodiment, the semiconductor substrate 11 is diced by the dicing cutter 21 in a state that it is fixed onto the dicing stage 23.

The dicing tape 19 is peeled from each of the semiconductor devices (dies) 22 separated by dicing, similar to the first embodiment. Then, each die 22 is picked up by a suction jig, which is called a collet, and transferred to a unit for executing a next process (for example, die boding).

Additionally, the portion of the semiconductor substrate 11 to which the reinforcing ring 13 is adhered is not used as the die 22, it is removed in a state that the reinforcing ring 13 is adhered as it is.

As mentioned above, even if the heat resistance adhering material layer 25 formed of polyimide resin is used to adhere the reinforcing ring 13 to the semiconductor substrate 11, the same effect as that of the first embodiment can be obtained.

Moreover, in the manufacturing method of this embodiment, after the first tape member 12 is peeled from the semiconductor substrate 11, the reinforcing ring 13 is adhered to the semiconductor substrate 11. For this reason, there is no need of considering heat resistance of the first tape member 12 at the time of fixing the reinforcing ring 13. As a result, flexibility in selecting the material to be used as the first tape member 12 is increased as compared with the first embodiment and cost reduction can be obtained.

Furthermore, in the manufacturing method of this embodiment, since the thinly processed semiconductor substrate 11 is heated, it is possible to reduce warpage caused by the difference in the coefficient of linear expansion between the semiconductor substrate 11 and the first tape member 12.

According to the manufacturing method of this embodiment, the number of processes to remount the tape member is reduced as compared with the manufacturing method of the first embodiment, so that higher productivity can be realized.

Additionally, the manufacturing methods of the first and second embodiments can be executed by causing a computer to control the transferring unit, semiconductor processing unit and the like based on a program.

The present invention is not limited to the aforementioned embodiments. For example, the manufacturing methods of the first and second embodiments may be appropriately combined. For example, in the first embodiment, the heat resistance adhering material layer 25 may be used in place of the inorganic adhering material layer 14, and in the second embodiment, the inorganic adhering material layer 14 may be used in place of the heat resistance adhering material layer 25.

In the first and second embodiments, the explanation is given of the case in which the reinforcing ring 13 is formed of the same material as that of the semiconductor substrate 11 as an example. The use of such a structure makes it possible to set the coefficient of linear expansion of the semiconductor substrate 11 and that of the reinforcing ring 13 to be the same and to reduce or prevent strain caused by the difference in the coefficient of linear expansion. However, as long as generation of strain caused by the difference in the coefficient of linear expansion can be reduced or prevented, the reinforcing ring 13 may be formed of other materials.

In the first and second embodiments, the explanation is given of the case in which the semiconductor substrate 11 is formed of a single crystal silicon substrate as an example. However, the semiconductor substrate 11 may be formed of a compound semiconductor such as indium phosphide, silicon carbide, etc.

In the first and second embodiments, the explanation is given of the case in which the power semiconductor device is manufactured as an example. However, the present invention is not limited to this, and the other type of semiconductor device using a relative thin semiconductor substrate may be manufactured.

This application is based on Japanese Patent Application No. 2002-183939 filed on Jun. 25, 2002 and Japanese Patent Application No. 2002-319884 filed on Nov. 1, 2002, specification, claims and drawings of which are incorporated herein by reference in its entirety.

INDUSTRIAL APPLICABILITY

The present invention can be used in the method for manufacturing the semiconductor device including a relatively thin semiconductor substrate.

The invention claim is:

1. A semiconductor device manufacturing method comprising:
    a first step of preparing a semiconductor substrate (11) on which multiple semiconductor devices are formed and thinning the semiconductor substrate (11);
    a second step of adhering a reinforcing member (13) having an opening to one surface of the semiconductor substrate (11) thinned in the first step with an adhering material having a state;
    a third step of forming a metallic film (15) for forming an electrode provided in the semiconductor device on a portion of one surface of the semiconductor substrate (11) to which the reinforcing member (13) is adhered, the portion being exposed through the opening of the reinforcing member or the other surface of the semiconductor substrate (11); and
    a fourth step of removing the reinforcing member (13) from the semiconductor substrate (11) and dicing the semiconductor substrate (11); and
    wherein the adhering material (13, 25) is formed of material which changes its state at temperature higher than a processing temperature in the third step.

2. The semiconductor device manufacturing method according to claim 1,
    wherein the reinforcing member (13) has an opening at its center and a ring shape with an outer diameter equal to an outer diameter of the semiconductor substrate (11);
    wherein the second step combines an outer periphery of the semiconductor substrate (11) with an outer periphery of the ring-shape reinforcing member (13) to adhere the reinforcing member (13) to one surface of the semiconductor substrate (11) with the adhering material; and
    wherein the third step forms the metallic film (15) on the exposed one surface of the semiconductor substrate (11) through the opening of the ring-shape reinforcing member (13).

3. The semiconductor device manufacturing method according to claim 1, wherein the adhering material is formed of a metal or alloy having a melting point higher than a processing temperature in the third step or heat resistance resin having a melting point or a softening point higher than the processing temperature in the third step.

4. The semiconductor device manufacturing method according to claim 3, wherein the heat resistance resin is polyimide resin.

5. The semiconductor device manufacturing method according to claim 3, wherein in the second step, the adhering material (14, 25) is formed on one surface of the reinforcing member (13) which has a ring shape, one surface of the reinforcing member (13) is placed on one surface of the semiconductor substrate (11) and the adhering material (14, 25) disposed between the reinforcing member (13) and the semiconductor substrate (11) is melted by heating, and the adhering material (14, 25) is hardened by cooling to adhere the reinforcing member (13) to the semiconductor substrate (11).

6. The semiconductor device manufacturing method according to claim 5,
    wherein in the first step, a first tape reinforcing member (12) is adhered to the other surface of the prepared semiconductor substrate (11) with an organic adhesive and one surface of the semiconductor substrate (11) is thinly processed in a state that the first tape reinforcing member (12) is adhered, thereby thinning the semiconductor substrate (11) up to a predetermined thickness;
    wherein in the second step, the reinforcing member (13) is adhered to one surface of the semiconductor substrate with the adhering material (14) in a state that the first tape reinforcing member (12) is adhered to the other surface of the semiconductor substrate (11); and
    wherein in the third step, the metallic film (15) is formed on one surface of the semiconductor substrate (11) through the opening of the reinforcing member (13) after removing the first tape reinforcing member (12) from the semiconductor substrate (11) in a state that the reinforcing member (13) is adhered to the semiconductor substrate (11).

7. The semiconductor device manufacturing method according to claim 6, wherein the adhering material (14) has a melting point lower than heat resistance temperature of the first tape reinforcing member (12).

8. The semiconductor device manufacturing method according to claim 6, wherein in the fourth step, a second tape reinforcing member (18) is adhered to the other surface of the semiconductor substrate (11), the reinforcing member (13) is removed from one surface of the semiconductor substrate (11), and the semiconductor substrate (11) is diced into chips (22) that form the respective semiconductor devices.

9. The semiconductor device manufacturing method according to claim 8,
wherein the adhering material (14) has a melting point lower than heat resistance temperature of the second tape reinforcing member (18); and the adhering material (14) is melted by heating at temperature lower than heat resistance temperature of the second tape reinforcing member (18), thereby removing the reinforcing member (13) from the semiconductor substrate (11).

10. The semiconductor device manufacturing method according to claim 3,
wherein in the first step, a first tape reinforcing member (12) is adhered to the other surface of the prepared semiconductor substrate (11) with an organic adhesive and one surface of the semiconductor substrate (11) is thinly processed, thereby thinning the semiconductor substrate (11) up to a predetermined thickness; and
wherein in the second step, the semiconductor substrate (11) is fixed onto a stage (24) having a heater and the semiconductor substrate (11) fixed onto the stage (24) is heated, thereby warpage caused on the semiconductor substrate (11) by a difference between a coefficient of linear expansion of the first tape reinforcing member (12) and a coefficient of linear expansion of the semiconductor substrate (11) is reduced.

11. A ring-shape reinforcing member, which is used in a manufacturing process of a semiconductor device having a semiconductor substrate (11) thinly processed to a predetermined thickness,
said ring-shaped reinforcing member having an opening at its center, having a ring shape with an outer diameter equal to an outer diameter of the semiconductor substrate (11), and being adhered to one surface of the semiconductor substrate (11) with an adhering material, thereby enhancing strength of the semiconductor substrate (11) reduced by thinly processing, the opening of said ring-shaped reinforcing member exposing the one surface of the semiconductor substrate (11) and having such a diameter as enabling a metallic film to be formed on the one surface of the semiconductor substrate (11).

12. The ring-shape reinforcing member according to claim 11, wherein the ring-shape reinforcing member has a thickness larger than the predetermined thickness of the thinly processed semiconductor substrate.

13. The ring-shape reinforcing member according to claim 12, wherein the ring-shape reinforcing member is formed of the same material as that of the semiconductor substrate (11) and has a coefficient of linear expansion equal to that of the semiconductor substrate (11).

14. A semiconductor device manufacturing method comprising:
a first step of preparing a semiconductor substrate (11) on which multiple semiconductor devices are formed and thinning the semiconductor substrate (11);
a second stop of adhering a reinforcing member (13) through which a part of one surface of the semiconductor substrate (11) is exposed to the one surface thereof with an adhering material having a state;
a third step of forming a metallic film (15) for forming an electrode provided in the semiconductor device on an exposed portion of one surface of the semiconductor substrate (11) or the other surface of the semiconductor substrate (11); and
a fourth step of removing the reinforcing member (13) from the semiconductor substrate (11) and dicing the semiconductor substrate (11),
wherein the adhering material (13, 25) is formed of material which changes its state at temperature higher than a processing temperature in the third step,
wherein the adhering material is formed of a metal or alloy having a melting point higher than the processing temperature in the third step or heat resistance resin having a melting point or a softening point higher than the processing temperature in the third step,
wherein in the second step, the adhering material (14, 25) is formed on one surface of the reinforcing member (13) which has a ring-shape,
wherein one surface of the reinforcing member (13) is placed on one surface of the semiconductor substrate (11) and the adhering material (14, 25) disposed between the reinforcing member (13) and the semiconductor substrate (11) is melted by heating, and
wherein the adhering material (14, 25) is hardened by cooling to adhere the reinforcing member (13) to the semiconductor substrate (11).

15. A semiconductor device manufacturing method comprising:
a first step of preparing a semiconductor substrate (11) on which multiple semiconductor devices are formed and thinning the semiconductor substrate (11);
a second step of adhering a reinforcing member (13) through which a part of one surface of the semiconductor substrate (11) is exposed to the one surface thereof with an adhering material having a state;
a third step of forming a metallic film (15) for forming an electrode provided in the semiconductor device on an exposed portion of one surface of the semiconductor substrate (11) or the other surface of the semiconductor substrate (11); and
a fourth step of removing the reinforcing member (13) from the semiconductor substrate (11) and dicing the semiconductor substrate (11),
wherein the adhering material (13, 25) is formed of material which changes its state at temperature higher than a processing temperature in the third step,
wherein the adhering material is formed of a metal or alloy having a melting point higher than the processing temperature in the third step or heat resistance resin having a melting point or a softening point higher than the processing temperature in the third step,
wherein in the first step, a first tape reinforcing member (12) is adhered to the other surface of the prepared semiconductor substrate (11) with an organic adhesive and one surface of the semiconductor substrate (11) is thinly processed, thereby thinning the semiconductor substrate (11) up to a predetermined thickness, and
wherein in the second step, the semiconductor substrate (11) is fixed onto a stage (24) having a heater and the semiconductor substrate (11) fixed onto the stage (24) is heated, thereby warpage caused on the semiconductor substrate (11) by a difference between a coefficient of linear expansion of the first tape reinforcing member (12) and a coefficient of linear expansion of the semiconductor substrate (11) is reduced.

16. A ring-shape reinforcing member, which is used in a manufacturing process of a semiconductor device having a semiconductor substrate (11) thinly processed to a predetermined thickness,
wherein said ring-shaped reinforcing member has an opening at its center, has a ring shape with an outer diameter equal to an outer diameter of the semiconductor substrate (11), and is adhered to one surface of the semiconductor substrate (11) with an adhering material, thereby enhancing strength of the semiconductor substrate (11) reduced by thinly processing,
wherein the ring-shape reinforcing member has a thickness larger than the predetermined thickness of the thinly processed semiconductor substrate, and
wherein the ring-shape reinforcing member is formed of the same material as that of the semiconductor substrate (11) and has a coefficient of linear expansion equal to that of the semiconductor substrate (11).

17. The ring-shape reinforcing member according to claim 16,
wherein the adhering material is formed of a metal or alloy having a melting point higher than a processing temperature for forming a thin film on the semiconductor substrate or heat resistance resin having a melting point or a softening point higher than the processing temperature.

* * * * *

UNITED STATES PATENT AND TRADEMARK OFFICE
CERTIFICATE OF CORRECTION

| | | |
|---|---|---|
| PATENT NO. | : 7,148,126 B2 | Page 1 of 1 |
| APPLICATION NO. | : 10/518131 | |
| DATED | : December 12, 2006 | |
| INVENTOR(S) | : Humiaki Mita | |

It is certified that error appears in the above-identified patent and that said Letters Patent is hereby corrected as shown below:

Title Page, Item (73) Assignee: Please delete "Niiza" and insert --Saitama--.

Signed and Sealed this

Thirteenth Day of March, 2007

JON W. DUDAS
*Director of the United States Patent and Trademark Office*